(12) United States Patent
Wang

(10) Patent No.: US 12,408,468 B2
(45) Date of Patent: Sep. 2, 2025

(54) SOLAR CELL AND PREPARATION METHOD THEREOF

(71) Applicant: Trina Solar Co., Ltd., Jiangsu (CN)

(72) Inventor: Zigang Wang, Jiangsu (CN)

(73) Assignee: Trina Solar Co., Ltd., Jiangsu (CN)

( * ) Notice: Subject to any disclaimer, the term of this patent is extended or adjusted under 35 U.S.C. 154(b) by 0 days.

(21) Appl. No.: 18/226,203

(22) Filed: Jul. 25, 2023

(65) Prior Publication Data

US 2024/0145617 A1    May 2, 2024

(30) Foreign Application Priority Data

Oct. 28, 2022 (CN) .......................... 202211333808.2

(51) Int. Cl.
| | |
|---|---|
| *H10F 71/00* | (2025.01) |
| *B23K 26/0622* | (2014.01) |
| *B23K 26/067* | (2006.01) |
| *B23K 26/354* | (2014.01) |
| *B23K 26/402* | (2014.01) |
| *H10F 77/20* | (2025.01) |
| *H10F 77/30* | (2025.01) |
| *B23K 101/40* | (2006.01) |

(52) U.S. Cl.
CPC ..... *H10F 71/1221* (2025.01); *B23K 26/0624* (2015.10); *B23K 26/0676* (2013.01); *B23K 26/354* (2015.10); *B23K 26/402* (2013.01); *H10F 77/219* (2025.01); *H10F 77/311* (2025.01); *B23K 2101/40* (2018.08)

(58) Field of Classification Search
CPC ... H10F 71/1221; H10F 77/219; H10F 77/311
See application file for complete search history.

(56) References Cited

U.S. PATENT DOCUMENTS

| | | |
|---|---|---|
| 8,486,747 B1 | 7/2013 | Gilman |
| 10,868,210 B2 | 12/2020 | Chung et al. |

(Continued)

FOREIGN PATENT DOCUMENTS

WO    WO-2011145731 A1 * 11/2011 ......... H01L 31/02167

OTHER PUBLICATIONS

European Patent Office, Extended European Search Report, Mar. 27, 2024, Appl'n. No. EP23186641.9.

(Continued)

*Primary Examiner* — Golam Mowla
(74) *Attorney, Agent, or Firm* — HOUTTEMAN LAW LLC

(57) ABSTRACT

The present disclosure provides a solar cell and a preparation method thereof, belongs to the technical field of solar cells. The preparation method of a solar cell according to the present disclosure includes: forming a passivation structure on a contact silicon layer at a back side of a silicon substrate; where the back side is a side opposite to a light incident side; removing the passivation structure located at least part of an electrode region by laser to form a contact opening, melting at least part of the contact silicon layer at the contact opening by laser, and solidifying the molten contact silicon layer to form a re-solidified structure; where the electrode region is a region configured to form a back electrode; and electroplating to form a back electrode in the electrode region on the back side of the contact silicon layer.

18 Claims, 6 Drawing Sheets

(56) References Cited

U.S. PATENT DOCUMENTS

| | | | | |
|---|---|---|---|---|
| 2010/0294349 A1* | 11/2010 | Srinivasan | .......... | H01L 21/2255 |
| | | | | 257/E21.328 |
| 2012/0103408 A1* | 5/2012 | Moslehi | ................ | H10F 19/908 |
| | | | | 257/E31.124 |
| 2023/0327030 A1* | 10/2023 | Li | ........................ | H10F 77/311 |
| | | | | 136/256 |

OTHER PUBLICATIONS

IP Australia, First Office Action, Apr. 30, 2024, Appl'n No. AU2023208078.

* cited by examiner

SOLAR CELL AND PREPARATION METHOD THEREOF

The present disclosure claims priority from the Chinese patent application entitled "SOLAR CELL AND PREPARATION METHOD THEREOF" with an application date of Oct. 28, 2022 and an application No. 202211333808.2, the entirety of which is incorporated herein by reference.

TECHNICAL FIELD

The present disclosure belongs to the technical field of solar cells, and specifically relates to a solar cell and a preparation method thereof.

BACKGROUND

In a passivated contact solar cell, such as a tunnel oxide passivated contact (TOPCon) solar cell or a silicon heterojunction (HJT) solar cell, a back electrode may be formed on a back side of the cell through an electroplating process.

However, the current back electrode formed through electroplating has poor adhesion, or is complex in preparation process and low in efficiency.

SUMMARY

Aiming to at least partially solve the problem of poor adhesion of back electrodes formed through electroplating in conventional solar cells, or the problem of complex preparation process and low efficiency, the present disclosure provides a solar cell and a preparation method thereof which form a back electrode with high adhesion through electroplating without adding the preparation steps or reducing the cell efficiency.

In a first aspect, an embodiment of the present disclosure provides a preparation method of a solar cell, including:
  forming a passivation structure on a contact silicon layer at a back side of a silicon substrate; wherein the back side is a side opposite to a light incident side;
  removing the passivation structure located at least part of an electrode region by laser to form a contact opening, melting at least part of the contact silicon layer at the contact opening by laser, and solidifying the molten contact silicon layer to form a re-solidified structure; wherein the electrode region is a region configured to form a back electrode; and
  electroplating to form a back electrode in the electrode region on the back side of the contact silicon layer.

Optionally, removing the passivation structure located at least part of the electrode region by laser to form the contact opening, and melting at least part of the contact silicon layer at the contact opening by laser includes:
  irradiating the passivation structure located at least part of the electrode region by laser, and evaporating and removing the irradiated passivation structure to form a contact opening; and
  irradiating the contact silicon layer located at least part of the contact opening by laser to melt the contact silicon layer.

Optionally, the laser used for evaporating and removing the passivation structure has a pulse duration between 1 ps and 30 ps, and an energy density between 0.2 J/cm$^2$ and 1.2 J/cm$^2$; and
  the laser used for melting the contact silicon layer has a pulse duration between 1 ns and 50 ns, and an energy density between 0.1 J/cm$^2$ and 0.5 J/cm$^2$.

Optionally, a pattern of the laser used for evaporating and removing the passivation structure includes a plurality of non-overlapping first spots (light spots), each of which has a radial dimension between 40 μm and 60 μm; and
  a pattern of the laser used for melting the contact silicon layer includes second spots centered on the respective first spots, each of the second spots has a radial dimension between 20 μm and 40 μm and less than the radial dimension of the first spot where it is located.

Optionally, removing the passivation structure located at least part of the electrode region by laser to form the contact opening includes:
  irradiating the passivation structure at a plurality of spaced positions in the electrode region by laser, removing the irradiated passivation structure to form a contact opening, and tilting an edge portion of the remaining passivation structure close to the contact opening;
  wherein the back electrode has a thickness greater than the passivation structure.

Optionally, a part of the tilted edge portion of the passivation structure closest to the contact silicon layer forms an angle between 15° and 60° with the contact silicon layer.

Optionally, a maximum distance between the tilted edge portion of the passivation structure and the contact silicon layer is between 250 nm and 2000 nm.

Optionally, in a direction from the tilted edge portion of the passivation structure to a center of the passivation structure, an orthographic projection of the tilted edge portion of the passivation structure on the contact silicon layer has a size between 1 μm and 4 μm.

Optionally, the tilted edge portion of the passivation structure has a curved structure.

Optionally, a distance between two adjacent spaced positions is between 1 μm and 20 μm.

Optionally, the passivation structure has a thickness between 50 nm and 200 nm; and
  the back electrode has a thickness between 1 μm and 12 μm.

Optionally, the re-solidified structure has a depth between 30 nm and 1000 nm.

Optionally, a tunneling layer is provided on the back side of the silicon substrate; and
  the contact silicon layer is a poly-Si (polysilicon layer) layer on a back side of the tunneling layer.

Optionally, before forming the passivation structure on the contact silicon layer at the back side of the silicon substrate, the method further includes:
  polishing the back side of the contact silicon layer.

In a second aspect, an embodiment of the present disclosure provides a solar cell, including:
  a silicon substrate having a contact silicon layer on a back side thereof; wherein the back side is a side opposite to a light incident side;
  a passivation structure on a back side of the contact silicon layer, wherein the passivation structure has a contact opening formed by laser in at least part of an electrode region, and at least part of the contact silicon layer at the contact opening is a re-solidified structure; the electrode region is a region configured to form a back electrode, and the re-solidified structure is a structure formed by solidifying the contact silicon layer after laser melting; and
  a back electrode in the electrode region; wherein the back electrode is provided on a side of the passivation structure away from the silicon substrate, and formed on the contact silicon layer through electroplating.

Optionally, a plurality of spaced contact openings are provided in the electrode region, and an edge portion of the passivation structure close to the contact openings is tilted; and the back electrode has a thickness greater than the passivation structure.

Optionally, the solar cell further satisfies at least one of the following conditions:

a part of the tilted edge portion of the passivation structure closest to the contact silicon layer forms an angle between 15° and 60° with the contact silicon layer;

a maximum distance between the tilted edge portion of the passivation structure and the contact silicon layer is between 250 nm and 2000 nm;

in a direction from the tilted edge portion of the passivation structure to a center of the passivation structure, an orthographic projection of the tilted edge portion of the passivation structure on the contact silicon layer has a size between 1 µm and 4 µm;

the tilted edge portion of the passivation structure has a curved structure, and a distance between two adjacent contact openings is between 1 µm and 20 µm.

Optionally, the passivation structure has a thickness between 50 nm and 200 nm; and the back electrode has a thickness between 1 µm and 12 µm.

Optionally, the re-solidified structure has a depth between 30 nm and 1000 nm.

Optionally, a tunneling layer is provided on the back side of the silicon substrate; and the contact silicon layer is a poly-Si layer on a back side of the tunneling layer.

According to the embodiments of the present disclosure, when or after the passivation structure at the back side of the solar cell is subjected to laser grooving to form the contact opening, the contact silicon layer at the contact opening is further melted by laser and then solidified again to form a re-solidified structure, and then a back electrode is formed on the re-solidified structure through electroplating. In this way, the re-solidified structure is not specially grown and is not polished, which has a rough surface and a larger contact area with the back electrode, so that the electroplated back electrode has higher adhesion. Meanwhile, since both the re-solidified structure and the contact opening are formed by laser, the method can be implemented simply by changing technological parameters of the laser grooving and the like without adding a separate step. Therefore, the preparation process is relatively simple. In addition, the rougher re-solidified structure is formed only on the back side of the contact silicon layer corresponding to the back electrode, while most of the back side of the contact silicon layer remains smooth, so that the rough surface takes a very small proportion and the efficiency of the cell will not be influenced.

Figure 1:
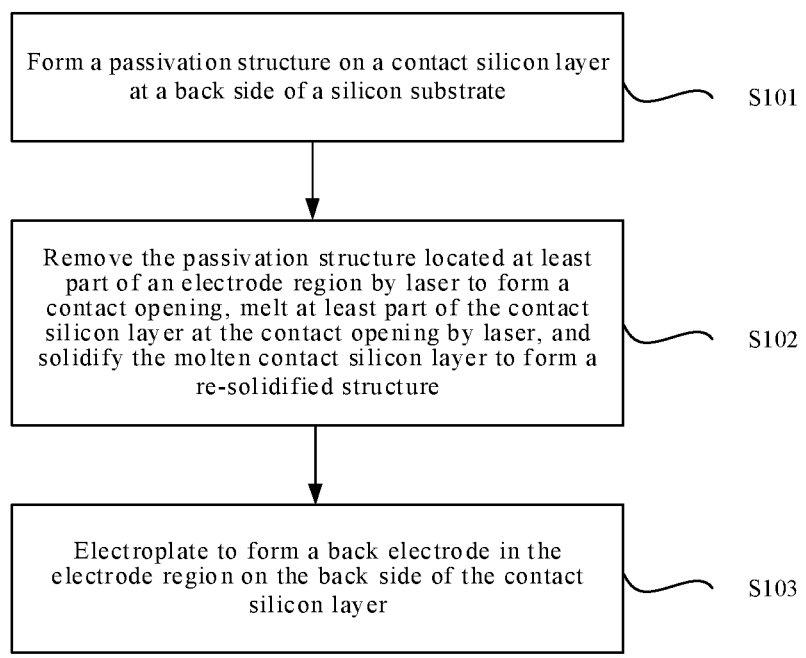
FIG. 1 is a schematic flowchart of a preparation method of a solar cell according to an embodiment of the present disclosure.

Reference Signs: 1. silicon substrate; 11. re-solidified structure; 2. passivation structure; 21. contact opening; 3. back electrode; 31. main gate line; 32. thin gate line; 5. contact silicon layer; 91. first spot; and 92. second spot.

DETAIL DESCRIPTION OF EMBODIMENTS

To improve understanding of the technical solution of the present disclosure for those skilled in the art, the present disclosure will be described in detail with reference to accompanying drawings and specific implementations.

It will be appreciated that the specific embodiments and drawings described herein are used merely for the purpose of explaining the present disclosure instead of limiting the present disclosure.

It will be appreciated that embodiments of the present disclosure and features thereof may be combined with each other as long as they are not contradictory.

It will be appreciated that, for convenience of description, only parts related to embodiments of the present disclosure are shown in the drawings, and parts not related to embodiments of the present disclosure are not shown in the drawings.

Tunnel oxide passivated contact (TOPCon) solar cells, silicon heterojunction (HJT) solar cells and the like belong to passivated contact solar cells. In other words, in the passivated contact solar cells, one or more passivation layers that act as field passivation are formed at a back side (rear) of the solar cell, so that the passivated contact solar cell has a further improved cell efficiency (e.g., more than 25%) compared to a passivated emitter and rear solar cell (PERC).

If silver paste sintering is adopted to form an electrode (gate line) in the passivated contact solar cell, a ratio of the silver paste cost may be obviously increased (increased from 10% to 11% in the PERC cell to 16% to 24%), which limits wider applications of the passivation contact solar cell.

In view of this, in some related art, a groove may be formed in the passivation layer at the back side of the passivated contact solar cell by laser, to expose a conductive structure (e.g., a contact silicon layer) for contacting a back electrode, and form the back electrode on the exposed contact silicon layer by electroplating, thereby reducing the costs.

However, since the back side of the solar cell is not used for light incidence, the back side of the contact silicon layer is typically not chemically textured, or even needs to be polished, thereby forming a smooth surface, resulting in a small contact area with the electrode and poor adhesion and easy peeling of the back electrode formed by electroplating.

If the back side of the contact silicon layer is also chemically textured to increase the contact area and the adhesion of the back electrode, on one hand, a texturing step needs to be added, leading to a complex preparation process, and on the other hand, the textured back side may increase the optical parasitic absorption and reduce the cell efficiency.

In a first aspect, referring to FIGS. 1 to 10, an embodiment of the present disclosure provides a preparation method of a solar cell.

The preparation method of a solar cell according to the embodiment of the present disclosure is used for forming a solar cell, especially a passivated contact solar cell (i.e., a solar cell with a passivation layer on the back side), such as a TOPCon solar cell, an HJT solar cell, or the like.

Referring to FIG. 1, a preparation method of a solar cell according to an embodiment of the present disclosure includes the following steps S101 to S103.

At S101, forming a passivation structure 2 on a contact silicon layer 5 at a back side of a silicon substrate 1.

The back side is a side opposite to a light incident side.

At S102, removing the passivation structure 2 located at least part of an electrode region by laser to form a contact opening 21, melting at least part of the contact silicon layer 5 at the contact opening 21 by laser, and solidifying the molten contact silicon layer 5 to form a re-solidified structure 51.

The electrode region is a region configured to form a back electrode 3.

At S103, electroplating to form a back electrode 3 in the electrode region on the back side of the contact silicon layer 5.

Figure 3:
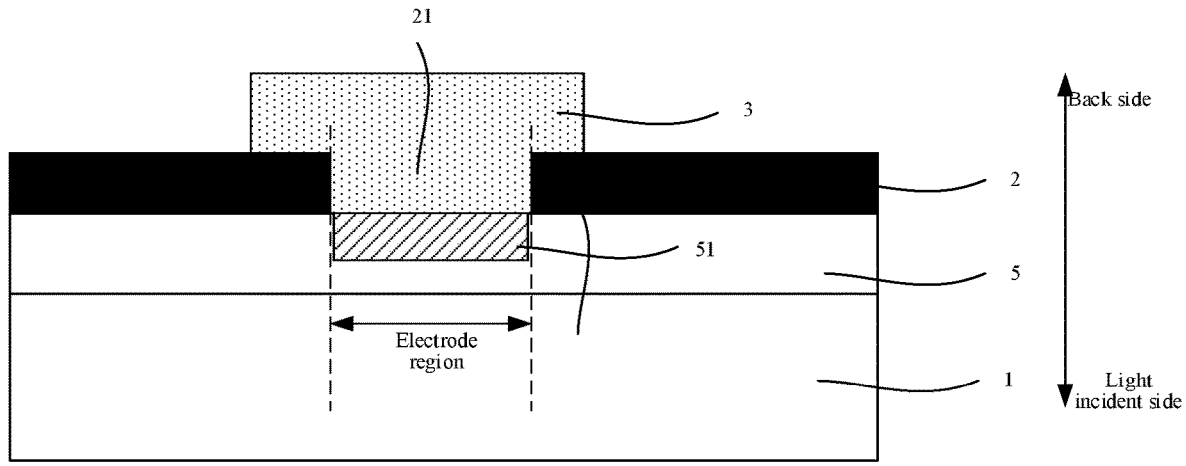
FIG. 3 is a schematic sectional view of a solar cell according to an embodiment of the present disclosure.

Referring to FIG. 3, the solar cell has a "silicon substrate 1" made of a silicon-based material, and the silicon substrate 1 has a light incident side facing sunlight on one side and a back side opposite to the light incident side on the other side.

The contact silicon layer 5, also made of a silicon-based material, for contacting the back electrode 3 is provided on the back side of the silicon substrate 1.

One or more passivation layers are formed on the back side of the contact silicon layer 5, and all the passivation layers form the passivation structure 2 as a whole.

After formation of the passivation structure 2, the passivation structure 2 located at least part of a region where the back electrode 3 is to be formed (an electrode region) is removed by laser grooving, to expose the conductive contact silicon layer 5, i.e., to form a "contact opening 21" in the passivation structure 2.

During or after formation of the contact opening 21, the contact silicon layer 5 at the contact opening 21 is locally heated by laser, so that the heated contact silicon layer 5 is melted (but does not evaporated), and then solidified again, i.e., forms the re-solidified structure 51.

After formation of the re-solidified structure 51, electroplating is performed through the conductive contact silicon layer 5 (re-solidified structure 51) exposed at the contact opening 21, to form the back electrode 3 in the electrode region on the back side of the contact silicon layer 5.

The specific electroplating solution, electroplating parameters and the like adopted in the electroplating process may be set according to the material, the parameters, and the like of the back electrode 3, which are not described in detail herein.

According to the embodiment of the present disclosure, when or after the passivation structure 2 (passivation layer) at the back side of the solar cell is subjected to laser grooving to form the contact opening 21, the contact silicon layer 5 at the contact opening 21 is further melted by laser and then solidified again to form the re-solidified structure 51, and then the back electrode 3 is formed on the re-solidified structure 51 through electroplating. In this way, the re-solidified structure 51 is not specially grown and is not polished, which has a rough surface and a larger contact area with the back electrode 3, so that the electroplated back electrode 3 has higher adhesion. Meanwhile, since both the re-solidified structure 51 and the contact opening 21 are formed by laser, the method can be implemented simply by changing technological parameters of the laser grooving and the like without adding a separate step. Therefore, the preparation process is relatively simple. In addition, the rougher re-solidified structure 51 is formed only on the back side of the contact silicon layer 5 corresponding to the back electrode 3, while most of the back side of the contact silicon layer 5 remains smooth, so that the rough surface takes a very small proportion and the efficiency of the cell will not be influenced.

Optionally, a tunneling layer 59 is provided on the back side of the silicon substrate 1; and the contact silicon layer 5 is a poly-Si layer on a back side of the tunneling layer 59.

Figure 4:
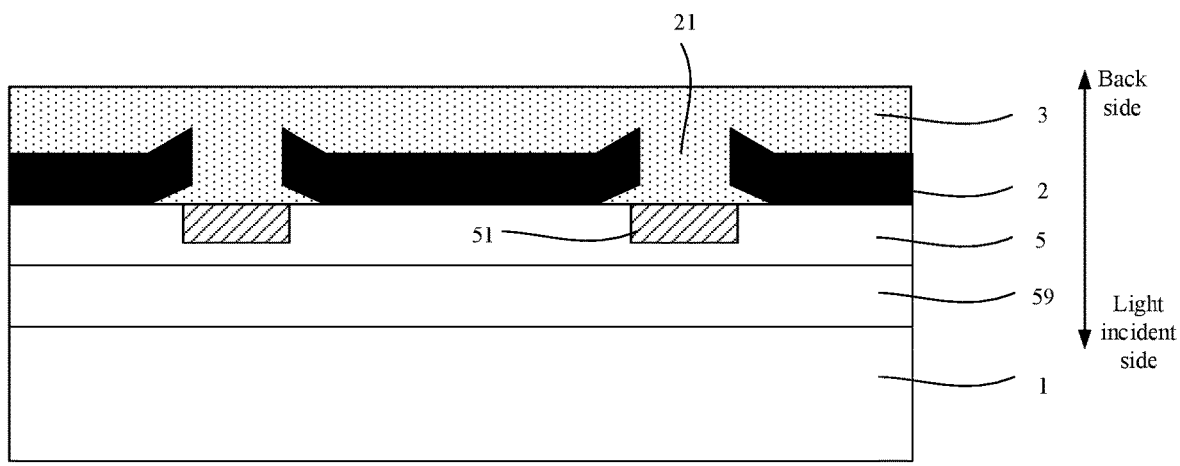
FIG. 4 is a schematic partial sectional view at an electrode region of another solar cell according to an embodiment of the present disclosure.

Referring to FIG. 4, as a manner provided in an embodiment of the present disclosure, a tunneling layer 59 of silicon oxide (SiOx) or the like may be formed on the back side of the silicon substrate 1, a poly-Si layer may be formed outside the tunneling layer 59, and the poly-Si layer is the partially molten contact silicon layer 5 mentioned above.

When the molten contact silicon layer 5 is solidified again to form the re-solidified structure 51, the environment is difficult to control precisely, so that the re-solidified structure 51 is usually polycrystalline, and accordingly, a contact silicon layer 5 of a poly-Si material may be used.

It will be appreciated that the contact silicon layer 5 may also take other forms.

For example, if the back electrode 3 is in direct contact with the silicon substrate 1, a region of the silicon substrate 1 itself close to the back side also serves as the contact silicon layer 5.

Figure 2:
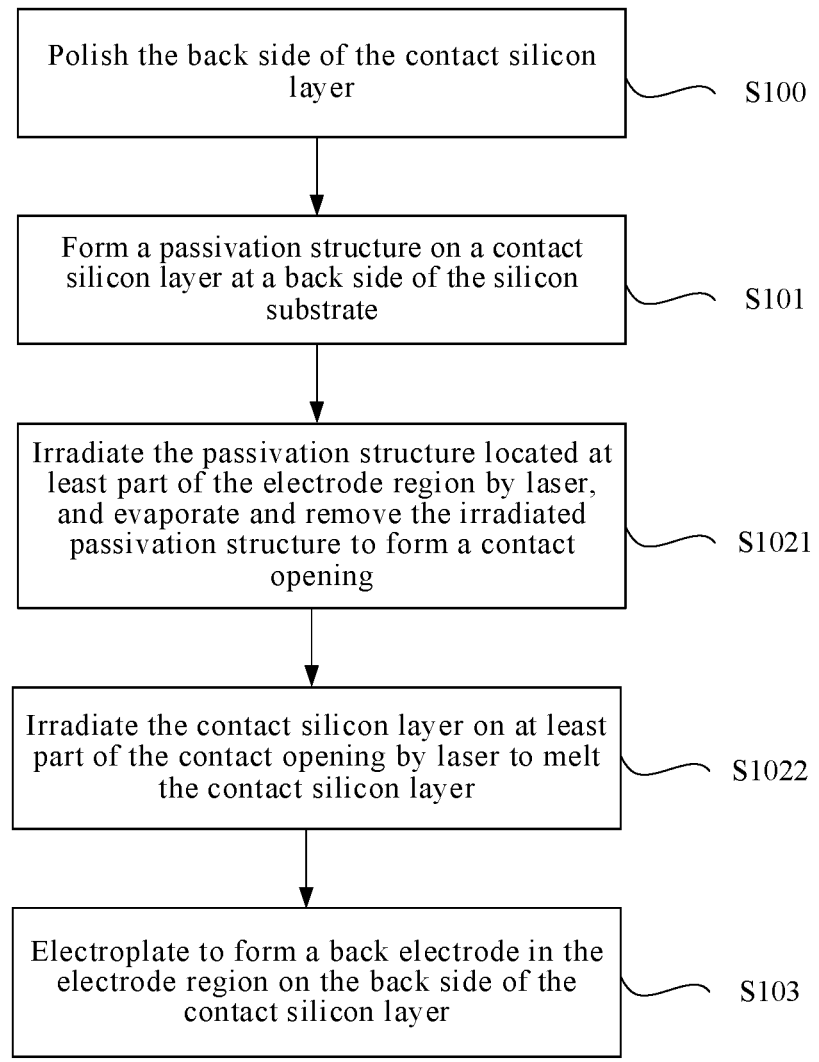
FIG. 2 is a schematic flowchart of another preparation method of a solar cell according to an embodiment of the present disclosure.

Optionally, referring to FIG. 2, removing the passivation structure 2 located at least part of the electrode region by laser to form the contact opening 21, and melting (S102) at least part of the contact silicon layer 5 at the contact opening 21 by laser includes the following steps S1021 to S1022.

At S1021, irradiating the passivation structure 2 located at least part of the electrode region by laser, and evaporating and removing the irradiated passivation structure 2 to form the contact opening 21.

At S1022, irradiating the contact silicon layer 5 located at least part of the contact opening 21 by laser to melt the contact silicon layer 5.

Figure 5:
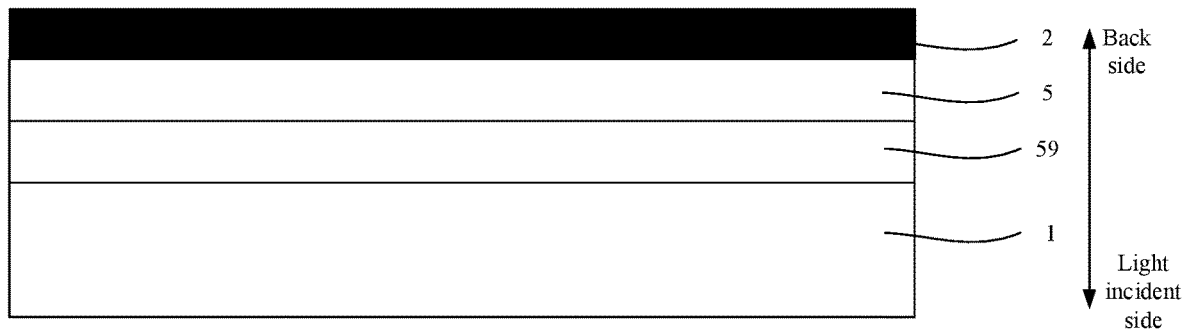
FIG. 5 is a schematic partial sectional view at an electrode region of another solar cell according to an embodiment of the present disclosure after forming a passivation structure.

As a manner provided in an embodiment of the present disclosure, referring to FIG. 5, a complete passivation structure 2 is firstly formed on the back side of the contact silicon layer 5. Thereafter, referring to FIG. 6, the passivation structure 2 at the position to be removed is irradiated with a laser, so that the passivation structure 2 is evaporated to form a contact opening 21. Then, referring to FIG. 7, parameters of the laser are modified (e.g., by reducing the laser energy, and changing the shape, size and energy distribution of the spots, or the like) to melt (but not vaporize) the contact silicon layer 5 located at least part of the contact opening 21, so that the contact silicon layer 5 is solidified again to form the re-solidified structure 51.

It will be appreciated that due to process accuracy limitations, the passivation structure 2 (contact opening 21) that is removed, as well as the molten contact silicon layer 5 (re-solidified structure 21), may be beyond a range of the laser irradiation, while the back electrode 3 may also be slightly beyond the electrode region.

It will be appreciated that during the removal of the passivation structure 2 and the molten contact silicon layer 5, it cannot be guaranteed that the contact silicon layer 5 is absolutely intact, i.e., the contact silicon layer 5 may also have some evaporation loss.

It will be appreciated that it is also possible if the contact silicon layer 5 is melted by heat while the passivation structure 2 is evaporated.

Optionally, the laser used for evaporating and removing the passivation structure 2 has a pulse duration between 1 ps and 30 ps, and an energy density between 0.2 J/cm² and 1.2 J/cm²; and the laser used for melting the contact silicon layer 5 has a pulse duration between 1 ns and 50 ns, and an energy density between 0.1 J/cm² and 0.5 J/cm².

As a manner provided in an embodiment of the present disclosure, the laser used for processing the passivation structure 2 is desired to evaporate the passivation structure 2, and thus has a higher intensity. For example, the pulse duration of the laser may be between 1 and 30 ps, and the energy density may be between 0.2 J/cm² and 1.2 J/cm². Further, the pulse duration may be between 3 and 10 ps, and the energy density may be between 0.3 J/cm² and 0.8 J/cm².

In contrast, the laser used for processing the contact silicon layer 5 is desired to melt the local contact silicon layer 5 but not cause significant evaporation of the contact silicon layer 5, and thus has a lower intensity. For example, the pulse duration of the laser may be between 1 and 50 ns, and the energy density may be between 0.1 J/cm² and 0.5 J/cm². Further, the pulse duration may be between 3 and 30 ns, and the energy density may be between 0.1 J/cm² and 0.3 J/cm².

In addition to the energy, the lasers of different functions may also differ in the wavelength, the energy distribution, the spot size, shape, or the like.

For example, the laser used for removing the passivation structure 2 may have a shorter wavelength, such as 355 nm; while the laser used for melting the contact silicon layer 5 may have a longer wavelength, such as 532 nm or 1064 nm.

For another example, the energy of the laser used for removing the passivation structure 2 may have a flat-top profile, while the energy of the laser used for melting the contact silicon layer 5 may have a Gaussian profile.

For yet another example and optionally, a pattern of the laser used for evaporating and removing the passivation structure 2 includes a plurality of non-overlapping first spots 91, each of which has a radial dimension between 40 μm and 60 μm; and a pattern of the laser used for melting the contact silicon layer 5 includes second spots 92 centered on the respective first spots 91, each of the second spots 92 has a radial dimension between 20 μm and 40 μm and less than the radial dimension of the first spot where it is located.

Figure 9:
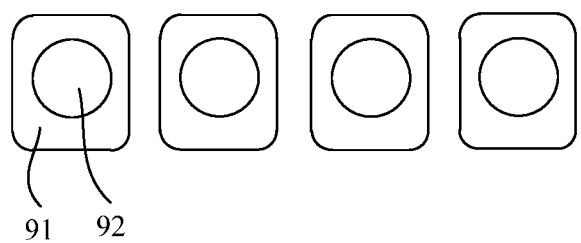
FIG. 9 is a schematic diagram of laser spot distribution during the preparation process of another solar cell according to an embodiment of the present disclosure.

Referring to FIG. 9, in an embodiment of the present disclosure, the spots (first spots 91) of the laser used for removing the passivation structure 2 may be not overlapped with each other (having intervals), and each first spot 91 may have a radial dimension between 40 and 60 μm, or further between 40 and 50 μm. For example, referring to FIG. 9, the first spot 91 may have a square shape (e.g., a square flat-top laser is used), and a side length of the rounded square may be between 40 and 60 μm.

In contrast, referring to FIG. 9, after the contact opening 21 is obtained, a second spot 92 "smaller" than the first spot 91 may be used to irradiate a center of the first spot 91 to melt the contact silicon layer 5 from the center of the contact opening 21. Each second spot 92 may have a radial dimension between 20 and 40 μm, or further between 30 and 40 μm. For example, referring to FIG. 9, the second spot 92 may have a circular shape (e.g., a circular Gaussian laser is used), and a diameter of the circle may be between 20 and 40 μm.

For example, specifically, after the passivation structure 2 is removed with each first spot 91, the pattern and energy distribution of the spots may be changed by diffraction etc., and the energy of the laser may be reduced, so that each first spot 91 is changed into the second spot 92, and the contact silicon layer 5 at the corresponding position is melted.

It will be appreciated that the laser used in the embodiments of the present disclosure may take other forms. For example, the plurality of first spots 91 may be overlapped, or the second spots 92 may be the same as the first spots 91 in size, shape and position.

Optionally, the re-solidified structure 51 has a depth between 30 nm and 1000 nm.

As a manner provided in an embodiment of the present disclosure, since the re-solidified structure 51 is mainly used as a structure for changing the surface in contact with the back electrode 3, the depth (a dimension in a direction perpendicular to the back side of the silicon substrate 1) of the re-solidified structure 51 should not be too large to affect properties of a main body of the contact silicon layer 5. For example, the depth of the re-solidified structure 51 may be between 30 and 1000 nm, or further between 30 and 100 nm.

Optionally, removing the passivation structure 2 located at least part of the electrode region by laser to form the contact opening 21 (S102) includes the following step S1029.

At S1029, irradiating the passivation structure 2 at a plurality of spaced positions in the electrode region by laser, removing the irradiated passivation structure 2 to form a contact opening 21, and tilting an edge portion of the remaining passivation structure 2 close to the contact opening 21.

The back electrode 3 has a thickness greater than the passivation structure 2.

Figure 6:
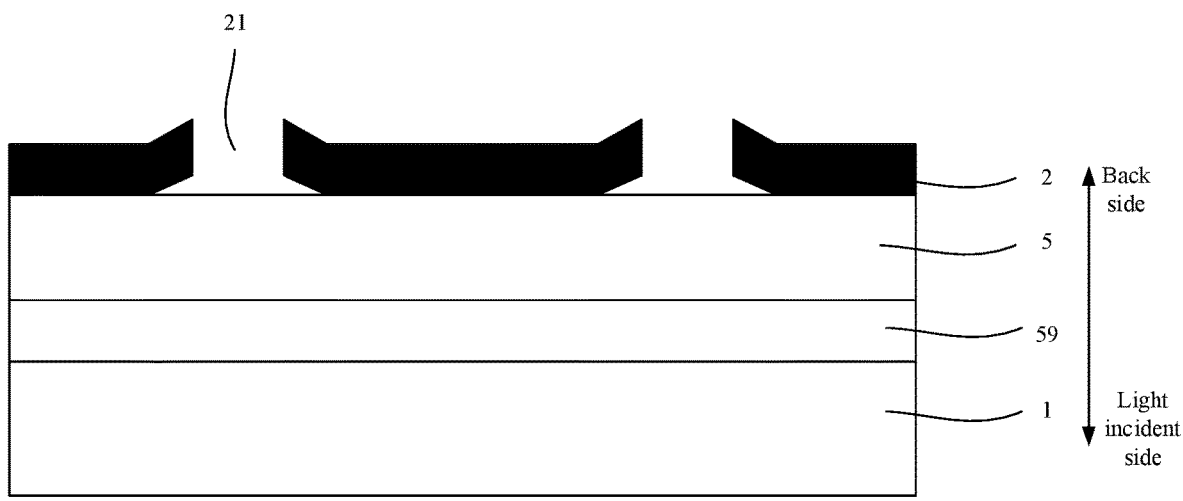
FIG. 6 is a schematic partial sectional view at an electrode region of another solar cell according to an embodiment of the present disclosure after forming a contact opening.
Figure 7:
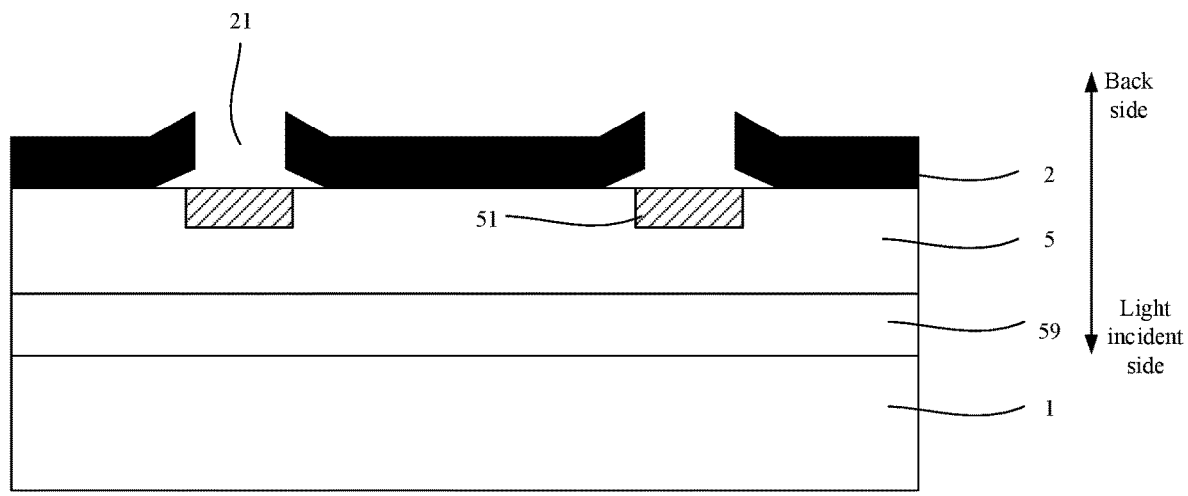
FIG. 7 is a schematic partial sectional view at an electrode region of another solar cell according to an embodiment of the present disclosure after forming a re-solidified structure.

As a manner provided in an embodiment of the present disclosure, referring to FIGS. 4, 6, and 7, instead of removing the passivation structure 2 completely from the electrode region, the passivation structure 2 may be removed from a plurality of spaced positions, so that a plurality of spaced contact openings 21 are formed in the electrode region, and passivation structures 2 are "left" at intervals among the contact openings 21.

Referring to FIGS. 4, 6, and 7, when the passivation structure 2 is removed by laser, due to an action of a thermal stress, thermal expansion and contraction, and the like, an edge portion of the remaining passivation structure 2 close to the contact opening 21 will be "tilted", and form a gap with the contact silicon layer 5.

Figure 8:
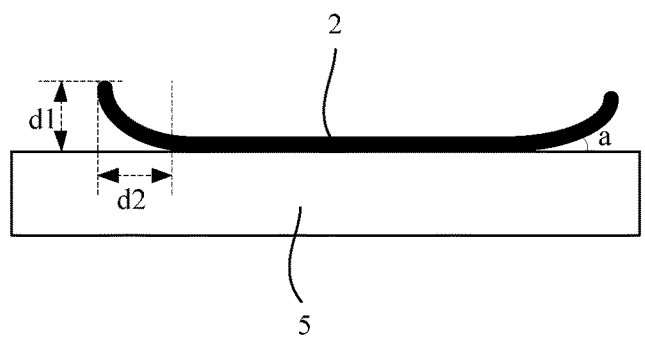
FIG. 8 is a schematic partial sectional view at a tilted edge portion of the passivation structure in another solar cell according to an embodiment of the present disclosure.

Thereby, referring to FIGS. 4 and 8, the passivation structure 2 remaining in the electrode region is divided into two parts, i.e., an "attached portion" at the center and attached to the contact silicon layer 5, and a "tilted portion" at the edge and opposite to the contact silicon layer 5.

Since the structure obtained by electroplating is grown from the substrate, referring to FIG. 4, the back electrode 3 prepared by electroplating will "extend" between the "tilted" portion at the edge of the passivation structure 2 and the contact silicon layer 5. Further, since the thickness (a dimension in the direction perpendicular to the back side of the silicon substrate 1) of the back electrode 3 is greater than the thickness (a dimension in the direction perpendicular to the back side of the silicon substrate 1) of the passivation structure 2, referring to FIG. 4, the back electrode 3 in the electrode region covers the remaining passivation structure 2. Thus, referring to FIG. 4, the "tilted" portion of the passivation structure 2 remaining in the electrode region may act to "trap" the back electrode 3 between the passivation structure 2 and the contact silicon layer 5, thereby further increasing the adhesion of the back electrode 3.

It will be appreciated that in addition to the tilting at the edge of the passivation structure 2 when forming the contact opening 21, a heating effect caused by melting the contact silicon layer 5 in the contact opening 21 may also contribute to further tilting at the edge of the passivation structure 2.

Specifically, referring to FIG. 9, the plurality of first spots 91 for removing the passivation structure 2 may have intervals therebetween (i.e., the spot overlapping ratio is 0), so that the passivation structure 2 is removed from only positions irradiated by the first spots 91. Therefore, a contact opening 21 is formed at the position of each first spot 91, while positions between the first spots 91 form the remaining passivation structure 2.

Optionally, a part of the tilted edge portion (i.e., the tilted portion) of the passivation structure 2 closest to the contact silicon layer 5 forms an angle between 15° and 60° with the contact silicon layer 5.

Referring to FIG. 8, a "root-most part (a part closest to the attached portion)" of the tilted portion of the passivation structure 2 forms an angle a with a surface of the contact silicon layer 5 where the passivation structure 2 is located, where the angle a may be specifically 15° to 60°, or further 15° to 45°.

Optionally, a maximum distance between the tilted edge portion of the passivation structure 2 and the contact silicon layer 5 is between 250 nm and 2000 nm.

Referring to FIG. 8, obviously, the closer the tilted portion of the passivation structure 2 to the "end", the further it is from the contact silicon layer 5, while a distance between the end of the tilted portion and the contact silicon layer 5 may be regarded as a "height d1" of the tilted portion, where the tilted height d1 may be between 250 and 2000 nm, or further between 500 and 1000 nm.

Optionally, in a direction from the tilted edge portion of the passivation structure 2 to a center of the passivation structure 2, an orthographic projection of the tilted edge portion of the passivation structure 2 on the contact silicon layer 5 has a size between 1 μm and 4 μm.

Referring to FIG. 8, only a partial region at the edge of the passivation structure 2 is tilted, and a dimension of that partial region in a direction from the edge to the center of the passivation structure 2 is a "width d2" of the tilted portion, where the width d2 may be between 1 and 4 μm, or further between 2 and 3 μm.

Optionally, the tilted edge portion 3 of the passivation structure 2 has a curved structure.

Referring to FIG. 8, the tilted portion of the passivation structure 2 may form a "curved surface".

For example, the tilted portion may be a smooth curved surface; where different parts of the curved surface may have a same curvature or different curvatures (including gradual changes along a certain direction); and where a "root part" of the curved tilted portion may be in "smooth transition" with the attached portion of the passivation structure 2, or may be bent at a certain angle.

It will be appreciated that the specific form of the tilted edge portion of the passivation structure 2 is not limited to the above examples.

For example, the tilted portion may have a substantially "flat plate shape", as shown in FIG. 4, or may have any other shape. For another example, tilted portions on two sides of one passivation structure 2 may be substantially symmetrical, or may have different structures (including shapes and sizes).

Optionally, a distance between two adjacent spaced positions is between 1 μm and 20 μm.

Referring to FIG. 9, a gap between spaced positions (first spots 91) of the laser irradiation for removing the passivation structure 2 (i.e., a gap between the contact openings 21) may be between 1 and 20 μm, or further between 4 and 10 nm, so as to achieve a better effect of increasing adhesion while avoiding an adverse effect on the conductivity (e.g., ohmic resistance) of the back electrode 3.

It will be appreciated that the specific forms of the contact opening 21 and the remaining passivation structure 2 in the electrode region are not limited thereto; and the specific distribution of the first spots 91 for removing the passivation structure 2 is not limited thereto. For example, a plurality of first spots 91 may be overlapped to form a "large" contact opening 21, and an interval is provided between different "large" contact openings 21.

It will be appreciated that the passivation structure 2 at the edge of the electrode region may form the above "tilted" structure, and the back electrode 3 may extend between that "tilted" structure and the contact silicon layer 5.

Optionally, the passivation structure 2 has a thickness between 50 nm and 200 nm; and the back electrode 3 has a thickness between 1 μm and 12 μm.

The thickness of the passivation structure 2 (a total thickness of all passivation layers) may be between 50 and 200 nm, or further between 70 and 120 nm. Accordingly, the thickness of the back electrode 3 may be between 1 and 12 nm, or further between 3 and 8 μm.

Optionally, referring to FIG. 2, before forming the passivation structure 2 on the contact silicon layer 5 at the back side of the silicon substrate 1 (S101), the method further includes the following step S100.

At S100, polishing the back side of the contact silicon layer 5.

It can be seen that the back electrode 3 is actually in contact with a surface of the re-solidified structure 51, so that the adhesion of the back electrode 3 is not affected regardless of the original smoothness of the back side of the contact silicon layer 5. In view of this, as a manner provided in an embodiment of the present disclosure, the entire contact silicon layer 5 on the back side of the silicon substrate 1 may be polished first to further improve the cell efficiency.

It will be appreciated that the specific form of each structure in the embodiments of the present disclosure may vary.

For example, the silicon substrate 1 may be made of a material including polysilicon, monocrystalline silicon, amorphous silicon, or the like, and may be doped as an N-type or P-type semiconductor, or have a doped layer on the surface.

Figure 10:
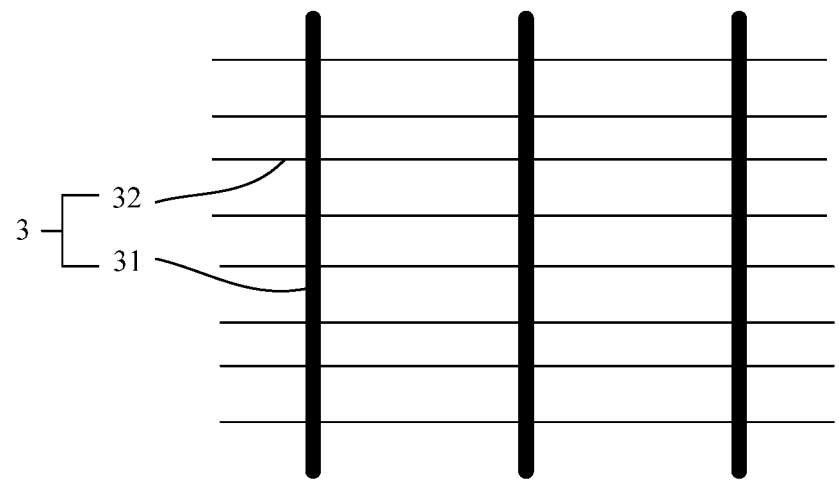
FIG. 10 is a schematic pattern of a back electrode in another solar cell according to an embodiment of the present disclosure.

For another example, the back electrode 3 (electrode region) may, specifically referring to FIG. 10, may include thicker main gate lines 31 and thinner gate lines 32 connected between the main gate lines 31 (in the related art, the thinner gate lines 32 typically have insufficient adhesion), and may specifically be an emitter.

If the thinner gate lines 32 have an appropriate size, a plurality of first spots 91 arranged in a row may be configured to form an electrode region corresponding to one thinner gate line 32.

For still another example, the specific material of the back electrode 3 may include an alloy of one or more of silver (Ag), nickel (Ni), and copper (Cu), or a composite structure of different materials.

For yet another example, on the light incident side of the silicon substrate 1, a textured surface (e.g., a large number of micro-pyramid structures) may be formed by chemical texturing, or a front passivation layer of aluminum oxide, silicon nitride, or the like may be formed.

For another example, a front electrode, such as a base electrode, may be formed on an outside of the front passivation layer through silver paste sintering process.

For still another example, other steps for forming the silicon substrate 1, the tunneling layer 59, the contact silicon layer 5, the light incident side structure, or the like may be included in the preparation process of the solar cell, which are not described in detail herein.

In a second aspect, referring to FIGS. 1 to 10, an embodiment of the present disclosure provides a solar cell.

The solar cell in this embodiment of the present disclosure is prepared in the above method, and thus has the corresponding structures.

The solar cell according to the embodiment of the present disclosure includes:

a silicon substrate 1 having a contact silicon layer 5 on a back side thereof; where the back side is a side opposite to a light incident side;

a passivation structure 2 on a back side of the contact silicon layer 5, where the passivation structure 2 has a contact opening 21 formed by laser in at least part of an electrode region, and at least part of the contact silicon layer 5 at the contact opening 21 is a re-solidified structure 51; the electrode region is a region configured to form a back electrode 3, and the re-solidified structure 51 is a structure formed by solidifying the contact silicon layer 5 after laser melting; and a back electrode 3 in the electrode region; where the back electrode 3 is provided on a side of the passivation structure 2 away from the silicon substrate 1, and formed on the contact silicon layer 5 through electroplating.

Optionally, a plurality of spaced contact openings 21 are provided in the electrode region, and an edge portion of the passivation structure 2 close to the contact openings 21 is tilted; and the back electrode 3 has a thickness greater than the passivation structure.

Optionally, the solar cell according to the embodiment of the present disclosure further satisfies at least one of the following conditions:

a part of the tilted edge portion of the passivation structure 2 closest to the contact silicon layer 5 forms an angle between 15° and 60° with the contact silicon layer 5;

a maximum distance between the tilted edge portion of the passivation structure 2 and the contact silicon layer 5 is between 250 nm and 2000 nm;

in a direction from the tilted edge portion of the passivation structure 2 to a center of the passivation structure 2, an orthographic projection of the tilted edge portion of the passivation structure 2 on the contact silicon layer 5 has a size between 1 μm and 4 μm;

the tilted edge portion 3 of the passivation structure 2 has a curved structure, and a distance between two adjacent contact openings 21 is between 1 μm and 20 μm.

Optionally, the passivation structure 2 has a thickness between 50 nm and 200 nm; and the back electrode 3 has a thickness between 1 μm and 12 μm.

Optionally, the re-solidified structure 51 has a depth between 30 nm and 1000 nm.

Optionally, a tunneling layer 59 is provided on the back side of the silicon substrate 1; and the contact silicon layer 51 is a poly-Si layer on a back side of the tunneling layer.

Comparative Example 1

In contrast, a TOPCon solar cell is provided, which includes an N-type doped monocrystalline silicon substrate.

A light incident side of the silicon substrate 1 is chemically textured and provided with a front passivation layer made of a composite material including silicon oxide/silicon nitride/aluminum oxide. A front electrode (base electrode), which penetrates into the front passivation layer and in contact with the silicon substrate 1, is formed on a side of the front passivation layer away from the silicon substrate 1 through silver paste sintering.

A back side of the silicon substrate 1 is chemically textured and sequentially provided with a tunneling layer 51 of silicon oxide and a poly-Si layer (contact silicon layer 5).

A passivation structure 2 is formed on the back side of the poly-Si layer. The passivation structure 2 has a thickness of 100 nm, and is made of a composite material including silicon oxide/silicon nitride.

The passivation structure 2 in the electrode region is completely removed through laser grooving to form a contact opening 21, and a back electrode 3 (emitter) is formed on the poly-Si layer at the contact opening 21 through electroplating. The back electrode 3 has a thickness of 5 μm, and is made of a nickel-copper-silver alloy.

After testing, the solar cell of comparative example 1 has a cell efficiency of 24.2%, and the adhesion of the back electrode 3 is 0.3 N/cm.

Comparative Example 2

The solar cell of this comparative example is similar to that of comparative example 1, except that the back side of the silicon substrate 1 is not textured and the poly-Si layer (contact silicon layer 5) is polished.

After testing, the solar cell of comparative example 2 has a cell efficiency of 24.5%, and the adhesion of the back electrode 3 is 0.1 N/cm.

Embodiment 1

An embodiment of the present disclosure provides a solar cell, which is similar to the solar cell of comparative example 2, except that after the contact opening 21 is formed in the passivation structure 2 by laser grooving, the poly-Si layer (contact silicon layer 5) at the contact opening 21 is further melted by laser and solidified again to form a re-solidified structure 51, so that the back electrode 3 thereof is in contact with the re-solidified structure 51.

The grooving laser is realized by a plurality of continuous first spots 91, where each first spot 91 is a square flat-top laser with a side length of 45 µm and an energy of 0.5 J/cm². Further, the silicon substrate 1 is melted through a second spot 92 at the center of each first spot 91, where the second spot 92 is a circular Gaussian laser with a diameter of 35 µm and an energy of 0.2 J/cm².

After testing, the solar cell of embodiment 1 has a cell efficiency of 24.45%, and the adhesion of the back electrode 3 is 0.3 N/cm.

It can be seen that, compared with the solar cell in which the back side of the silicon substrate 1 is also textured (comparative example 1), the solar cell according to the embodiment of the present disclosure has a simple preparation process (no texturing step) and higher cell efficiency, while the adhesion of the back electrode 3 is not reduced; and compared with the solar cell without texturing on the back side of the silicon substrate 1 (comparative example 2), the back electrode 3 in the solar cell according to the embodiment of the present disclosure obviously has higher adhesion, while the cell efficiency is not reduced.

Therefore, the embodiment of the present disclosure can improve the adhesion of the back electrode 3, and has a simple preparation process and high cell efficiency.

Embodiment 2

The solar cell of this embodiment is similar to that of embodiment 1, except that the passivation structure 2 in the electrode region is not completely removed, but forms a plurality of spaced contact openings 21.

In the embodiment of the present disclosure, the second spots 92 are spaced apart at an interval of 6 µm; and an edge portion of the passivation structure 2 in the electrode region forms the "tilted portion" mentioned above. The tilted edge portion (the tilted portion) forms an angle a of 30° with a surface of the poly-Si layer (contact silicon layer 5), has a height d1 of 500 nm and a width d2 of 2 µm, and substantially forms a curved surface.

As mentioned above, the passivation structure 2 has a thickness of 100 nm, while the back electrode 3 has a thickness of 5 µm, so the back electrode 3 has a thickness greater than the passivation structure 2.

After testing, the solar cell of embodiment 2 has a cell efficiency of 24.5%, and the adhesion of the back electrode 3 is 0.4 N/cm.

It can be seen that compared with the method of removing the passivation structure 2 completely from the electrode region, reserving a part of the passivation structure 2 in the electrode region can further increase the adhesion of the back electrode 3.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A preparation method of a solar cell, characterized in comprising:
   forming a passivation structure on a contact silicon layer at a back side of a silicon substrate; wherein the back side is a side opposite to a light incident side;
   removing the passivation structure located at least part of an electrode region by laser to form a contact opening, melting at least part of the contact silicon layer at the contact opening by laser, and solidifying the molten contact silicon layer to form a re-solidified structure; wherein the electrode region is a region configured to form a back electrode; and
   electroplating to form the back electrode in the electrode region on the back side of the contact silicon layer,
   characterized in that removing the passivation structure located at least part of the electrode region by laser to form the contact opening comprises:
   irradiating the passivation structure at a plurality of spaced positions in the electrode region by laser, removing the irradiated passivation structure to form a contact opening, and tilting an edge portion of the remaining passivation structure close to the contact opening;
   wherein the back electrode has a thickness greater than the passivation structure.

2. The preparing method according to claim 1, characterized in that removing the passivation structure located at least part of the electrode region by laser to form the contact opening, and melting at least part of the contact silicon layer at the contact opening by laser comprises:
   irradiating the passivation structure located at least part of the electrode region by laser, and evaporating and removing the irradiated passivation structure to form a contact opening; and
   irradiating the contact silicon layer located at least part of the contact opening by laser to melt the contact silicon layer.

3. The preparation method according to claim 2, characterized in that
   the laser used for evaporating and removing the passivation structure has a pulse duration between 1 ps and 30 ps, and an energy density between 0.2 J/cm² and 1.2 J/cm²; and
   the laser used for melting the contact silicon layer has a pulse duration between 1 ns and 50 ns, and an energy density between 0.1 J/cm² and 0.5 J/cm².

4. The preparation method according to claim 2, characterized in that
   a pattern of the laser used for evaporating and removing the passivation structure comprises a plurality of non-overlapping first spots, each of which has a radial dimension between 40 µm and 60 µm; and
   a pattern of the laser used for melting the contact silicon layer comprises second spots centered on the respective first spots, each of the second spots has a radial dimension between 20 µm and 40 µm and less than the radial dimension of the first spot where it is located.

5. The preparation method according to claim 1, characterized in that
   a part of the tilted edge portion of the passivation structure closest to the contact silicon layer forms an angle between 15° and 60° with the contact silicon layer.

6. The preparation method according to claim 1, characterized in that
   a maximum distance between the tilted edge portion of the passivation structure and the contact silicon layer is between 250 nm and 2000 nm.

7. The preparation method according to claim 1, characterized in that
   in a direction from the tilted edge portion of the passivation structure to a center of the passivation structure, an orthographic projection of the tilted edge portion of the passivation structure on the contact silicon layer has a size between 1 µm and 4 µm.

8. The preparation method according to claim 1, characterized in that
the tilted edge portion of the passivation structure has a curved structure.

9. The preparation method according to claim 1, characterized in that
a distance between two adjacent spaced positions is between 1 μm and 20 μm.

10. The preparation method according to claim 1, characterized in that
the passivation structure has a thickness between 50 nm and 200 nm; and
the back electrode has a thickness between 1 μm and 12 μm.

11. The preparation method according to claim 1, characterized in that
the re-solidified structure has a depth between 30 nm and 1000 nm.

12. The preparation method according to claim 1, characterized in that
a tunneling layer is provided on the back side of the silicon substrate; and
the contact silicon layer is a poly-Si layer on a back side of the tunneling layer.

13. The preparation method according to claim 1, characterized in that before forming the passivation structure on the contact silicon layer at the back side of the silicon substrate, the method further comprises:
polishing the back side of the contact silicon layer.

14. A solar cell, characterized in comprising:
a silicon substrate having a contact silicon layer on a back side thereof; wherein the back side is a side opposite to a light incident side;
a passivation structure on a back side of the contact silicon layer, wherein the passivation structure has a contact opening formed by laser in at least part of an electrode region, and at least part of the contact silicon layer at the contact opening is a re-solidified structure; the electrode region is a region configured to form a back electrode, and the re-solidified structure is a structure formed by solidifying the contact silicon layer after laser melting; and
the back electrode in the electrode region; wherein the back electrode is provided on a side of the passivation structure away from the silicon substrate, and formed on the contact silicon layer through electroplating, and
a plurality of spaced contact openings are provided in the electrode region, and an edge portion of the passivation structure close to the contact openings is tilted; and
the back electrode has a thickness greater than the passivation structure.

15. The solar cell according to claim 14, characterized in that the solar cell further satisfies at least one of the following conditions:
a part of the tilted edge portion of the passivation structure closest to the contact silicon layer forms an angle between 15° and 60° with the contact silicon layer;
a maximum distance between the tilted edge portion of the passivation structure and the contact silicon layer is between 250 nm and 2000 nm;
in a direction from the tilted edge portion of the passivation structure to a center of the passivation structure, an orthographic projection of the tilted edge portion of the passivation structure on the contact silicon layer has a size between 1 μm and 4 μm;
the tilted edge portion of the passivation structure has a curved structure, and
a distance between two adjacent contact openings is between 1 μm and 20 μm.

16. The solar cell according to claim 14, characterized in that
the passivation structure has a thickness between 50 nm and 200 nm; and
the back electrode has a thickness between 1 μm and 12 μm.

17. The solar cell according to claim 14, characterized in that the re-solidified structure has a depth between 30 nm and 1000 nm.

18. The solar cell according to claim 14, characterized in that a tunneling layer is provided on the back side of the silicon substrate; and
the contact silicon layer is a poly-Si layer on a back side of the tunneling layer.

* * * * *